United States Patent
Lee et al.

(10) Patent No.: US 7,442,596 B2
(45) Date of Patent: Oct. 28, 2008

(54) METHODS OF MANUFACTURING FIN TYPE FIELD EFFECT TRANSISTORS

(75) Inventors: Jong-Wook Lee, Yongin-si (KR); Deok-Hyung Lee, Yongin-si (KR); Min-Gu Kang, Namyangju-si (KR); Yu-Gyun Shin, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 236 days.

(21) Appl. No.: 11/359,000

(22) Filed: Feb. 22, 2006

(65) Prior Publication Data

US 2006/0189058 A1  Aug. 24, 2006

(30) Foreign Application Priority Data

Feb. 24, 2005  (KR) .................. 10-2005-0015221

(51) Int. Cl.
  *H01L 21/336* (2006.01)
  *H01L 21/8234* (2006.01)
(52) U.S. Cl. .................. 438/198; 438/281; 257/296
(58) Field of Classification Search ............... 438/198, 438/281, 287, 301, 595; 257/296, 347, 368
  See application file for complete search history.

(56) References Cited

U.S. PATENT DOCUMENTS

| 6,555,453 | B1 | 4/2003 | Xiang et al. ............... 438/581 |
| 6,770,516 | B2 | 8/2004 | Wu et al. ................... 438/154 |
| 6,969,659 | B1* | 11/2005 | Anderson et al. ........... 438/281 |
| 7,166,895 | B2* | 1/2007 | Saito ........................ 257/347 |
| 2005/0186742 | A1* | 8/2005 | Oh et al. .................... 438/283 |
| 2006/0071291 | A1* | 4/2006 | Yagishita ................... 257/471 |

FOREIGN PATENT DOCUMENTS

JP  10-093080  4/1998

* cited by examiner

*Primary Examiner*—Phuc T Dang
(74) *Attorney, Agent, or Firm*—Myers Bigel Sibley & Sajovec, P.A.

(57) ABSTRACT

A fin type field effect transistor includes a semiconductor substrate, an active fin, a first hard mask layer pattern, a gate insulation layer pattern, a first conductive layer pattern, and source/drain regions. The active fin includes a semiconductor material and is formed on the substrate and extends in a direction away from a major surface of the substrate. The first hard mask layer pattern is formed on a distal surface of the active fin from the substrate. The gate insulation layer is formed on a sidewall portion of the active fin. The first conductive layer pattern includes a metal silicide and is formed on surfaces of the substrate and the gate insulation layer pattern, and on a sidewall of the first hard mask pattern. The source/drain regions are formed in the active fin on opposite sides of the first conductive layer pattern.

19 Claims, 8 Drawing Sheets

METHODS OF MANUFACTURING FIN TYPE FIELD EFFECT TRANSISTORS

CROSS REFERENCE TO RELATED APPLICATION

This application claims priority under 35 USC § 119 to Korean Patent Application No. 10-2005-0015221, filed on Feb. 24, 2005, the contents of which are herein incorporated by reference in their entirety.

FIELD OF THE INVENTION

The present invention relates to field effect transistors and methods of manufacturing field effect transistors and, more particularly, to a field effect transistor formed on an active fin and methods of manufacturing the same.

BACKGROUND OF THE INVENTION

As semiconductor devices have become highly integrated, the gate length of horizontal field effect transistors has become shorter and led to problems associated with short channel effects. Short channel effects can be associated with reduced electromigration and driving current due to increased impurity concentration in a channel layer of the horizontal field effect transistor. Junction leakage current can also be increased due to shallow junction depth of source/drain regions in the horizontal field effect transistor.

In an attempt to avoid such problems in highly integrated horizontal field effect transistors, fin type field effect transistors with three-dimensional structures have been developed.

A fin type field effect transistor can be formed on a silicon-on-isolator (SOI) substrate. The fin type field effect transistor on the SOI substrate can have a low junction capacitance, high scale ability, a high driving current, etc. However, when an upper silicon layer of the SOI substrate has a non-uniform thickness, the threshold voltage of the transistor can be readily changed. Further, the driving current can be deteriorated due to a self-heating effect. Such problems in a fin type field effect transistor may be avoided if the upper silicon layer is formed with at least a defined sufficient thickness and/or using circuit design technologies which have been exclusively used for SOI substrates.

However, the thickness of the upper silicon layer can limit feature size, or width, of a pattern in the fin field effect transistor. Further, it can be very difficult to develop new circuit design technology, and the associated development cost may be unacceptably high.

When about 0V is applied to a gate electrode of the fin type field effect transistor, a channel region is fully depleted so that the short channel effect may not be generated. In contrast, it is difficult to obtain a threshold voltage of no less than about 0.1V due to the fully depleted gate electrode. However, to manufacture a desired integrated circuit, the threshold voltage is controllable in accordance with the desired integrated circuit. As a result, it can be necessary to configure the fin type field effect transistor with a threshold voltage of no less than about 0.1V.

SUMMARY OF THE INVENTION

In accordance with some embodiments of the present invention, a fin type field effect transistor includes a semiconductor substrate, an active fin, a first hard mask layer pattern, a gate insulation layer pattern, a first conductive layer pattern, and source/drain regions. The active fin includes a semiconductor material and is formed on the substrate and extends in a direction away from a major surface of the substrate. The first hard mask layer pattern is formed on a distal surface of the active fin from the substrate. The gate insulation layer is formed on a sidewall portion of the active fin. The first conductive layer pattern includes a metal silicide and is formed on surfaces of the substrate and the gate insulation layer pattern, and on a sidewall of the first hard mask pattern. The source/drain regions are formed in the active fin on opposite sides of the first conductive layer pattern. The fin type field effect transistor may thereby be configured so that its threshold voltage can be more readily controlled.

In accordance with some other embodiments of the present invention, a method of manufacturing a fin type field effect transistor includes forming a hard mask layer pattern on a substrate of a semiconductor material. The substrate is partially etched using the hard mask layer pattern as an etching mask to form an active fin extending in a direction away from a major surface of the substrate. The active fin includes a semiconductor material, and may be formed from the semiconductor material of the substrate. A gate insulation layer is partially on a sidewall portion of the active fin. A first conductive layer pattern including metal silicide is formed on surfaces of the substrate and the gate insulation layer pattern, and on a sidewall of the first hard mask pattern. Source/drain regions are formed in the active fin on opposite sides of the first conductive layer pattern.

According to some embodiments of the present invention, the first conductive layer pattern forms a gate electrode and includes the metal silicide. Thus, the gate electrode may have a higher threshold voltage than a conventional gate electrode including doped polysilicon so that the threshold voltage of the fin type field effect transistor may be more readily controlled.

Moreover, the first conductive layer pattern is formed on a limited region of the fin type field effect transistor, which may allow the entire gate electrode with the metal silicide to have more uniform characteristics. The fin type field effect transistor may thereby have more stable operational characteristics.

BRIEF DESCRIPTION OF THE DRAWINGS

The above and other features and potential advantages of the invention will become readily apparent by reference to the following detailed description when considered in conjunction with the accompanying drawings wherein.

DETAILED DESCRIPTION OF EMBODIMENTS OF THE INVENTION

Figure 1:
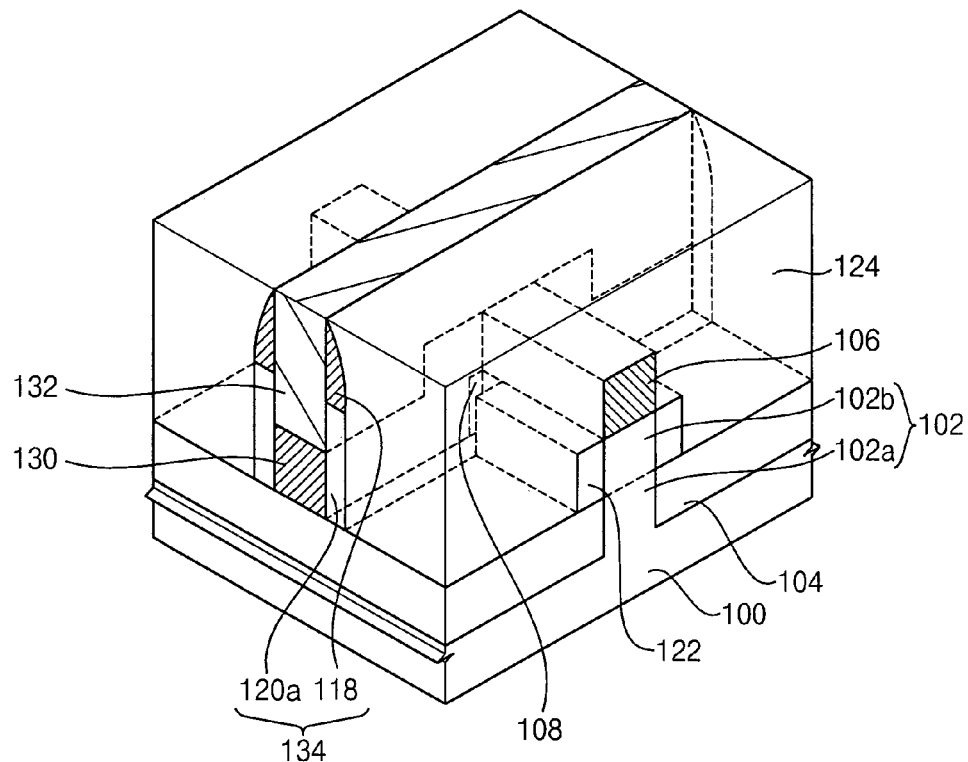
FIG. 1 is a cross sectional view illustrating a fin type field effect transistor in accordance with a first embodiment of the present invention.

The present invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region or etched region illustrated as a rectangle will, typically, have rounded or curved features and/or a gradient of implant concentration at its edges rather than a binary change from implanted to non-implanted region or etched to non-etched region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiment 1

FIG. 1 is a cross sectional view illustrating a fin type field effect transistor in accordance with a first embodiment of the present invention.

Referring to FIG. 1, an active fin 102 is formed on a surface of a semiconductor substrate 100 including silicon. The active fin 102 extends away from a major surface of the semiconductor substrate 100. The active fin 102 can be integrally formed with the semiconductor substrate 100, so that the active fin 102 can be formed from the same, or substantially the same, material as the semiconductor substrate 100. In some embodiments, the active fin 102 may have a width of no more than about 40 nm to allow control of a gate electrode formed on opposite sides of the active fin 102.

An isolation layer 104 is formed on the semiconductor substrate 100 to electrically isolate unit devices, which are formed on the active fin 102, from each other. The thickness of the isolation layer 104 is defined so that an upper portion of the active fin 102 protrudes through and exposes sidewalls of the upper portion of active fin 102.

The upper portion of the active fin 102, which is exposed above the isolation layer 104 and which does not contact with the isolation layer 104, is referred to as a first region 102b of the active fin 102. A lower portion of the active fin 102, which is not exposed through the isolation layer 104 and which directly contacts the isolation layer 104, is referred to as a second region 102a of the active fin 102. The first region 102b of the active fin 102 serves as an active region where a fin type field effect transistor is formed.

A first hard mask layer pattern 106 is formed on a distal surface of the first region 102b of the active fin 102 from the major surface of the substrate 100. The first hard mask layer pattern 106 may include silicon nitride. When the active fin 102 is formed directly on the first hard mask layer pattern 106, stresses may be generated in the active fin 102. To reduce/avoid such stress, a buffer oxide layer pattern (not shown) may be formed between the active fin 102 and the first hard mask layer pattern 106.

A gate insulation layer pattern 108 is partially formed on a sidewall of the active fin 102. The gate insulation layer pattern 108 may include silicon oxide. Alternatively, the gate insulation layer pattern 108 may include metal oxide having a dielectric constant higher than that of the silicon oxide. In the present embodiment, the gate insulation layer pattern 108 includes silicon oxide formed by a thermal oxidation process.

A first conductive layer pattern 130 is formed on surfaces of the isolation layer 104 and the gate insulation layer pattern 108, and a sidewall of the first hard mask layer pattern 106. The first conductive layer pattern 130 extends in a direction traversing the active fin 102, and may be formed so as to be substantially perpendicular to a lengthwise direction of the active fin 102. The first conductive layer pattern 130 can serve as the gate electrode of the fin type field effect transistor.

The entire first conductive layer pattern 130 can include metal silicide. Polysilicon doped with N type impurities or P type impurities may be silicidated to form the first conductive layer pattern 130. Examples of the metal silicide include cobalt silicide, titanium silicide, and/or nickel silicide.

The first conductive layer pattern 130 has a uniform thickness. When the first conductive layer pattern 130 has a thickness of below about 300 Å, the first conductive layer pattern 130 has a high resistance. Thus, the first conductive layer pattern 130 having the high resistance does not normally function as the gate electrode. On the contrary, when the first conductive layer pattern 130 has a thickness of above about 1,200 Å, the first conductive layer pattern 130 does not include metal silicide having uniform characteristics. Thus, the first conductive layer pattern 130 has a thickness of about 300 Å to about 1,200 Å, and may preferably have a thickness of about 500 Å to about 1,000 Å.

Here, the metal silicide used for forming the first conductive layer pattern 130 has a work function different from that of the polysilicon doped with impurities. Therefore, the fin type field effect transistor with the first conductive layer pattern 130 that includes metal silicide, in accordance with some embodiments of the present invention, has a threshold voltage Vt different from that of a conventional fin type field effect transistor with a gate electrode including doped polysilicon.

For example, a fin type field effect transistor that has the first conductive layer pattern 130 including the metal silicide, in accordance with some embodiments of the present invention, can have an absolute value |Vt| of a threshold voltage Vt of about 0.1V higher than that of the threshold voltage of a conventional fin type field effect transistor with a gate electrode of doped polysilicon. Consequently, a fin type field effect transistor configured in accordance with some embodiments of the present invention may have a relatively high threshold voltage compared to that of a conventional fin type field effect transistor.

For example, polysilicon that is heavily doped with N type impurities has a work function of about 4.0 eV to about 4.1 eV. Nickel silicide, formed by silicidating polysilicon doped with N type impurities, has a work function of about 4.3 eV to about 4.4 eV. Here, a difference between threshold voltages substantially similar to that between work functions of conductive layer patterns as a gate electrode is generated in the fin type field effect transistor. Thus, the exemplary fin type field effect transistor of some embodiments present invention having a gate electrode that includes nickel silicide, formed by silicidating the polysilicon doped with the N type impurities, has a threshold voltage of about 0.1V to about 0.4V higher than that of a conventional fin type field effect transistor having a gate electrode of polysilicon doped with N type impurities.

Further, polysilicon heavily that is doped with P type impurities has a work function of about 5.0 eV to about 5.1 eV. Nickel silicide formed by silicidating polysilicon doped with P type impurities has a work function of about 4.7 eV to about 4.8 eV.

Thus, the exemplary fin type field effect transistor of some embodiments of the present invention has the gate electrode including nickel silicide, formed by silicidating the polysilicon doped with the P type impurities, has a threshold voltage of about 0.1V to about 0.4V lower than that of a conventional fin type field effect transistor having a gate electrode of polysilicon doped with P type impurities. As a result, the exemplary fin type field effect transistor of some embodiments of the present invention having the gate electrode including the nickel silicide, formed by silicidating the polysilicon doped with the P type impurities, has an absolute value of the threshold voltage of about 0.1V to about 0.4V higher than that of the threshold voltage of a conventional fin type field effect transistor with a gate electrode of polysilicon doped with P type impurities.

A second conductive layer pattern 132 is formed on an upper surface of the first conductive layer pattern 130 opposite to the semiconductor substrate 100, a side face and an upper face of the first hard mask layer pattern 106. The second conductive layer pattern 132 can have a linear shape that extends in a direction substantially perpendicular to the lengthwise direction of the active fin 102. The second conductive layer pattern 132 may include a metal having an electrical resistance lower than that of the first conductive layer pattern 130. Exemplary materials of the second conductive layer pattern 132 include tungsten, titanium, and/or copper.

A spacer 134 is formed on sidewalls of the first and second conductive layer patterns 130 and 132. The spacer 134 includes a first spacer 120a and a second spacer 118 having an etching selectivity different from that of the first spacer 120a. In particular, the first spacer 120a is formed on a lower sidewall of the gate electrode including the first and second conductive layer patterns 130 and 132. The second spacer 118 is formed on the first spacer 120a. The second spacer 118 includes an insulation material having an etching selectivity higher than that of the first spacer 120a. For example, the first spacer 120a includes silicon oxide and the second spacer 118 includes silicon nitride.

When an upper face of the first spacer 120a is lower than that of the first hard mask layer pattern 106, an undesired spacer may be formed on portions of the sidewalls of the first hard mask layer pattern 106 and the active fin 102. The undesired spacer may prevent an active extension layer 122 from being formed directly on portions of the sidewall of the active fin 102, despite of an epitaxial growth process. Further, source/drain regions (not shown) may be formed in the active fin 102 in an asymmetrical shape. Accordingly, the upper face of the first spacer 120a adjacent to the first hard mask layer pattern 106 should be formed at least as higher as an upper face of the first hard mask layer pattern 106.

The active extension layer 122 is formed directly on the sidewall of the second region 102b of the active fin 102. The active extension layer 122 is spaced apart from the first conductive layer pattern 130 by a width of the first spacer 120a. The active extension layer 122 may be formed by epitaxially growing single crystalline silicon.

The source/drain regions are formed in the active fin 102 on opposite sides of the first conductive layer pattern 130, and in the active extension layer 122.

According to some embodiments of the present embodiment, because the source/drain regions are formed in the active extension layer 122 as well as the active fin 102, the source/drain regions may have a relatively low resistance so that the fin type field effect transistor may have an improved driving current. Further, when the first conductive layer pattern 130 does not intersect a center of the active fin 102, the source/drain regions may still be symmetrically formed and have low resistance. Thus, when polarities of the source/drain regions are reversed, the reversed source/drain regions may have substantially the same electrical characteristic so that the fin type field effect transistor may be more stably operated.

As a result, the exemplary fin type field effect transistor according to some embodiments present embodiment may provide more stable operational characteristics and/or a relatively high threshold voltage relative to that of conventional fin type field effect transistors.

FIGS. 2 to 14 are cross sectional views illustrating methods of manufacturing the fin type field effect transistor in FIG. 1 in accordance with some embodiments of the present invention.

Figure 2:
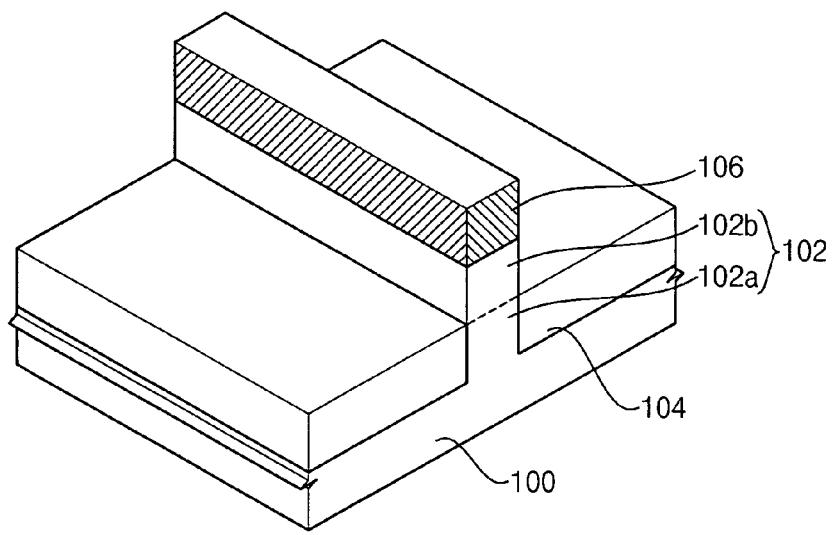
FIGS. 2 to 14 are cross sectional views illustrating methods of manufacturing the fin type field effect transistor in FIG. 1 in accordance with some embodiments of the present invention.

Referring to FIG. 2, a buffer oxide layer (not shown) is formed on a semiconductor substrate 100 including silicon. A first hard mask layer (not shown) including silicon nitride is then formed on the buffer oxide layer.

A photoresist film (not shown) is formed on the first hard mask layer. The photoresist film is exposed to form a photoresist pattern (not shown) for masking an active fin region. The first hard mask layer is etched using the photoresist pattern as an etching mask to form a first hard mask layer pattern 106.

The semiconductor substrate 100 is partially etched using the first hard mask layer pattern 106 to form the active fin 102 extends upward away from a major surface of the semiconductor substrate 100. Here, the active fin 102 extends in a first direction. In some embodiments, the active fin 102 may have a width of no more than about 40 nm to enable control of a gate electrode on opposite sides of the active fin 102 of a fin type field effect transistor.

The isolation layer 104 is formed on the semiconductor substrate 100 to electrically isolate unit devices, which are formed on the active fin 102, from each other. The thickness of the isolation layer 104 is defined so that an upper portion of the active fin 102 protrudes there-through and exposes sidewalls of the upper portion of active fin 102.

Here, the upper portion of the active fin 102, which is exposed through the isolation layer 104 and which does not make contact with the isolation layer 104, is referred to as the first region 102b of the active fin 102. A lower portion of the active fin 102, which is not exposed through the isolation layer 104 and makes contact with the isolation layer 104 and is in direct contact with the isolation layer 104, is referred to as the second region 102a of the active fin 102. The first region 102b of the active fin 102 serves as an active region where a fin type field effect transistor is formed.

Figure 3:
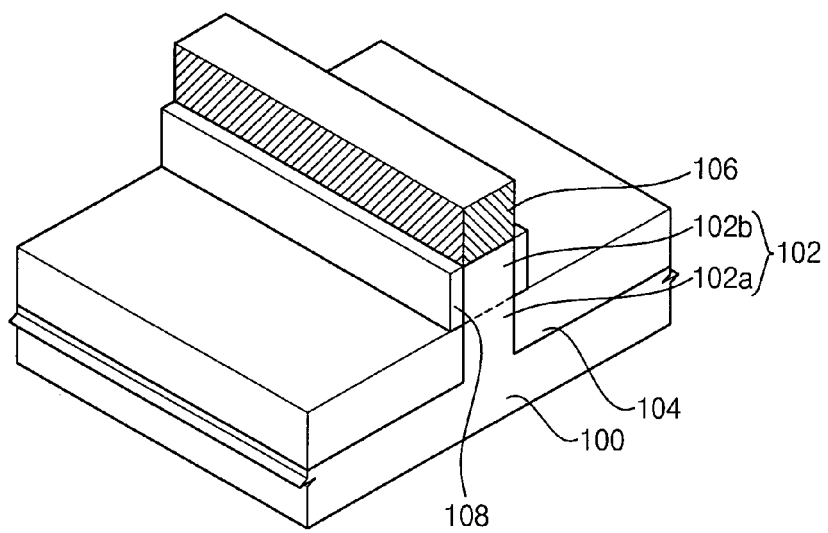

Referring to FIG. 3, the gate insulation layer 108 is selectively formed on sidewalls of the first region 102b of the active fin 102. A surface of the first region 102b of the active fin 102 may be thermally oxidized to form the gate insulation layer 108. Alternatively, metal oxide having a dielectric constant higher than that of silicon oxide may be deposited on the sidewalls of the first region 102b of the active fin 102 to form the gate insulation layer 108.

Figure 4:
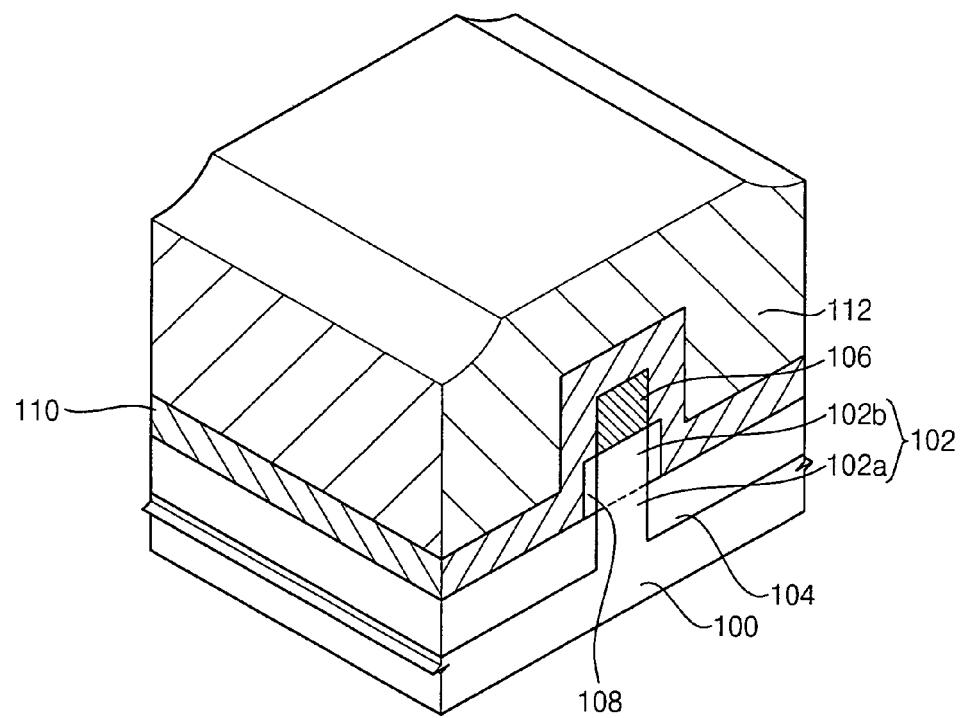

Referring to FIG. 4, polycrystalline silicon is deposited on the isolation layer 104, the gate insulation layer 108 and the first hard mask layer pattern 106 to form a first preliminary conductive layer 110. The first preliminary conductive layer 110 can be converted into a first conductive layer pattern including metal silicide by the following process.

When the first preliminary conductive layer 110 has a thickness of below about 200 Å, the first conductive layer pattern formed by the following process has a very small thickness. Thus, the first conductive layer pattern does not normally function as the gate electrode. In contrast, when the first preliminary conductive layer has a thickness of above about 1,000 Å, the first preliminary conductive layer 110 is not uniformly silicidated. Thus, the first preliminary conductive layer 110 may have a thickness of about 200 Å to about 1,000 Å.

N type impurities or P type impurities are implanted into the first preliminary conductive layer 110 by an ion implantation process or a plasma doping process.

A first dummy layer 112 is formed on the first preliminary conductive layer 110. The first dummy layer 112 has a first etching selectivity with respect to the first preliminary conductive layer 110, so that etching of the first dummy layer 112 may not cause substantial etching of the first preliminary conductive layer 110.

For example, the first dummy layer 112 can include polycrystalline silicon germanium. The polycrystalline silicon germanium may be deposited by a chemical vapor deposition (CVD) process using a silicon source gas and a germanium source gas to form the first dummy layer 112. Examples of the silicon source gas include $SiH_4$, DCS (Diclorosilane: $SiCl_2H_2$), and/or $Si_2H_6$. The germanium source gas may include $GeH_4$.

To provide the first dummy layer 112 and the first preliminary conductive layer 110 with a sufficiently high etching selectivity, the germanium can have a concentration of about 25% to about 50% of the polycrystalline silicon germanium.

Further, to fully bury the first preliminary conductive layer 110 in the first dummy layer 112, the first dummy layer 112 has a surface higher than that of the first preliminary conductive layer 110.

Figure 5:
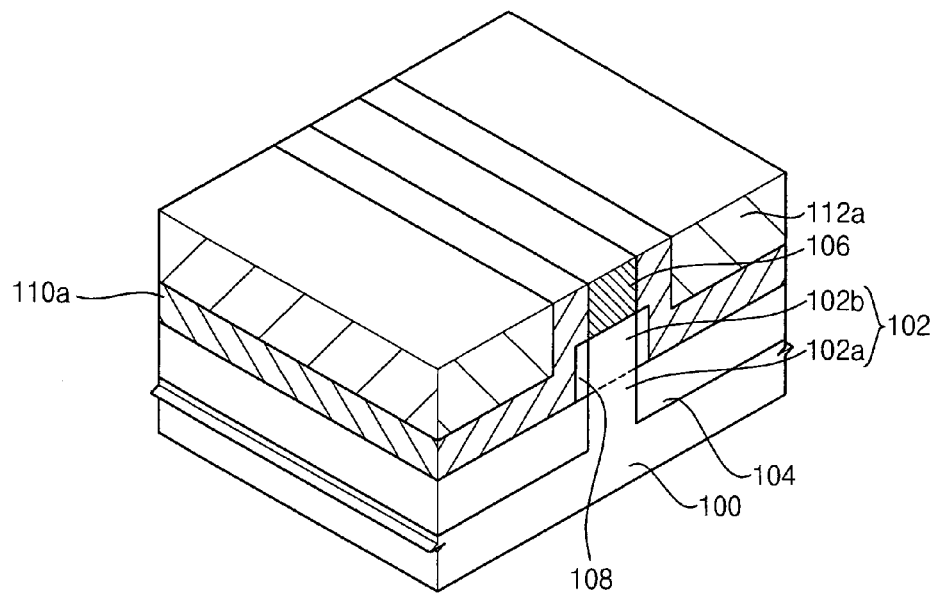

Referring to FIG. 5, the first preliminary conductive layer 110 and the first dummy layer 112 are removed by a chemical mechanical polishing (CMP) process until a surface of the first hard mask layer pattern 106 is exposed to form a second preliminary conductive layer 110a and a first preliminary dummy layer pattern 112a. The second preliminary conductive layer 110a is formed on surfaces of the isolation layer 104 and the gate insulation layer 108, and a sidewall of the first hard mask layer pattern 106. The first preliminary dummy layer pattern 112a is partially formed on the second preliminary conductive layer pattern 110a.

Figure 6:
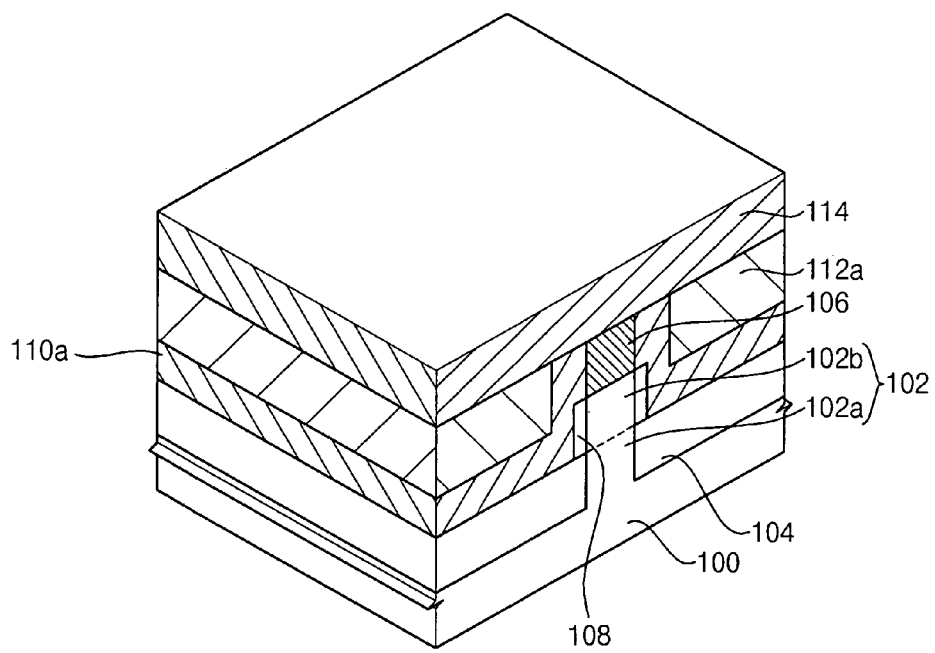

Referring to FIG. 6, a second dummy layer 114 is formed on the second preliminary conductive layer 110a, the first preliminary dummy layer pattern 112a and the first hard mask layer pattern 106.

Here, the second dummy layer 114 has a second etching selectivity with respect to the first preliminary dummy layer pattern 112a and the first hard mask layer pattern 106. Thus, while the second dummy layer 114 is etched, the first preliminary dummy layer pattern 112a and the first hard mask layer pattern 106 may not be etched or may be minimally etched. The second dummy layer 114 may include polycrystalline silicon. Further, since the second preliminary conductive layer 110a, the first preliminary dummy layer pattern 112a and the first hard mask layer pattern 106 have flat surfaces, the second dummy layer 114 has a flat surface.

Figure 7:
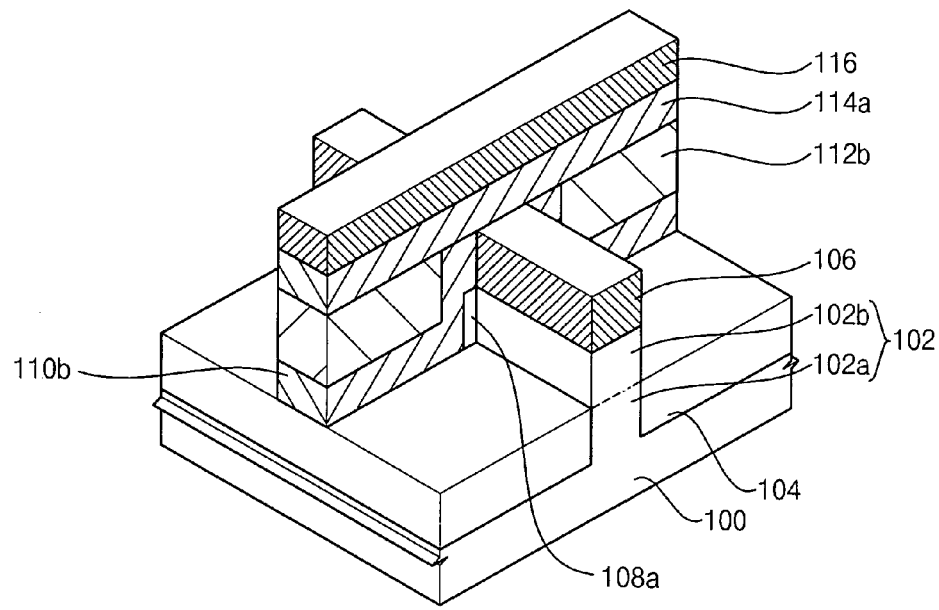

Referring to FIG. 7, a second hard mask layer (not shown) including silicon nitride is formed on the second dummy layer 114. The second hard mask layer is patterned by a photolithography process to form a second hard mask layer pattern 116 for defining a region where the gate electrode is formed. The second hard mask layer pattern 116 has a linear shape extending in a second direction substantially perpendicular to the first direction. Further, the second hard mask layer pattern 116 is intersected with the active fin 102. That is, the second hard mask layer pattern 116 is substantially perpendicular to the active fin 102.

The second dummy layer 114, the first preliminary dummy layer pattern 112a and the second preliminary conductive layer 110a are sequentially etched using the second hard mask layer pattern 116 as an etching mask to form a first preliminary conductive layer pattern 110b, a first dummy layer pattern 112b and a second dummy layer pattern 114a.

Simultaneously, while the first preliminary dummy layer pattern 112 and the second preliminary conductive layer 110a are etched, the gate insulation layer 106 on the sidewall of the active fin 102 is partially etched to form a gate insulation layer pattern 108a.

Figure 8:
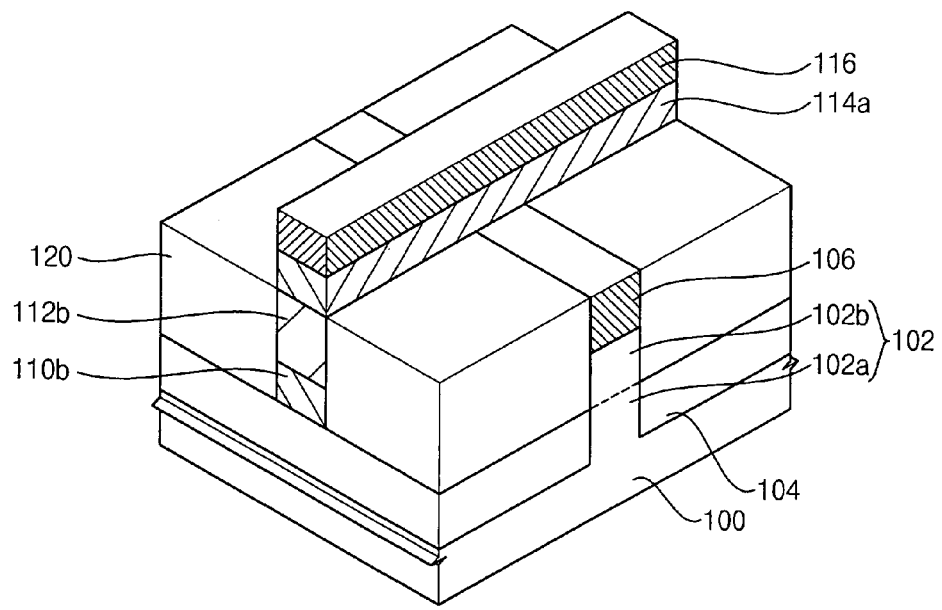

Referring to FIG. 8, silicon oxide is deposited on the isolation layer 104 by a CVD process to form a first insulation layer (not shown) fully covering the second hard mask layer pattern 116. Thus, the first insulation layer has a surface higher than that of the second hard mask layer pattern 116.

The first insulation layer is planarized by a CMP process. Here, when the CMP process is carried out until exposing a surface of the second hard mask layer pattern 116, a thickness of a remaining first insulation layer after performing the CMP process may be accurately measured so that following processes may be readily performed. Therefore, the first insulation layer is polished using the second hard mask layer pattern 116 as a polishing stop layer.

However, it is not necessarily to expose the second hard mask layer pattern 116 by the CMP process. Alternatively, the CMP process may be carried out to planarize the surface of the first insulation layer without exposing the second hard mask layer pattern 116.

The first insulation layer is anisotropically etched to form a first insulation layer pattern 120 exposing the second hard mask layer pattern 116 and sidewalls of the second dummy layer pattern 114a.

Since the first hard mask layer pattern 106 is almost not etched in the anisotropic etching process, the anisotropic etching process may be stopped when the surface of the first hard mask layer pattern 106 is exposed. Thus, as shown in FIG. 8, the first insulation layer is preferably etched until the surface of the hard mask layer pattern 106 is exposed to form the first insulation layer pattern 120.

Alternatively, as described above, the first insulation layer may be etched until the surface of the first hard mask layer pattern 106 is not exposed to form the first insulation layer pattern 120 having a surface higher than that of the first hard mask layer pattern 106. However, when the first insulation layer pattern 120 has the surface higher than that of the first hard mask layer pattern 106, an undesired spacer may be formed on the sidewalls of the active fin 102 in a following process for forming a spacer.

Figure 9:
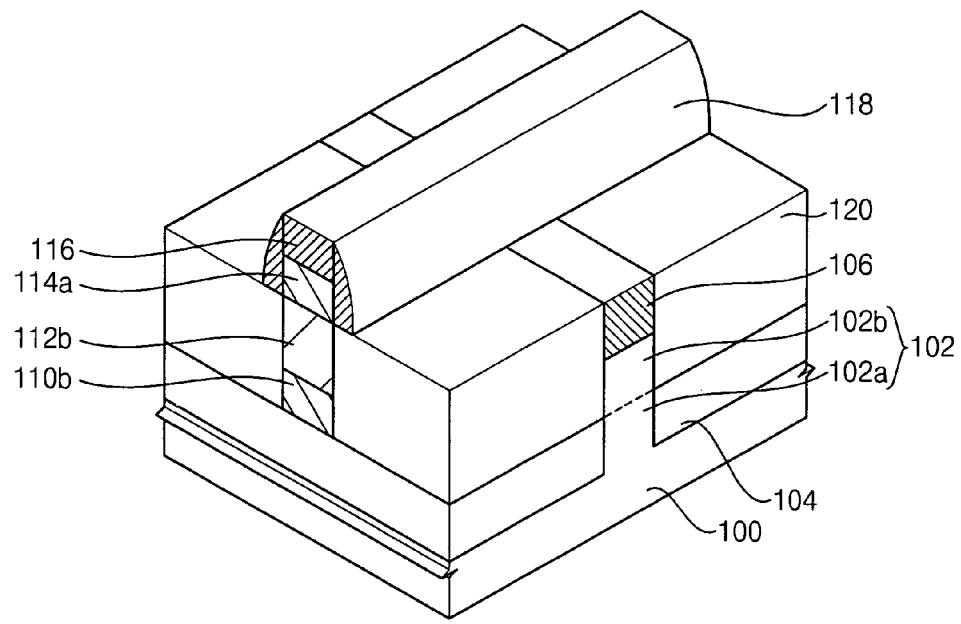

Referring to FIG. 9, an insulation layer (not shown) for a second spacer is formed on the second dummy layer pattern 114a, the second hard mask layer pattern 106 and the first insulation layer pattern 120. The insulation layer is anisotropically etched to form the second spacer 118. The second spacer 118 serves as an etching mask for etching the first insulation layer pattern 120. Thus, the second spacer 118 includes a material having an etching selectivity different from that of the first insulation layer pattern 120. The second spacer 118 may include silicon nitride.

In addition, before forming the insulation layer for the second spacer 118, a silicon oxide layer (not shown) having a thickness of no more than about 100 Å may be formed on the second dummy layer pattern 114a and the second hard mask layer pattern 116.

Figure 10:
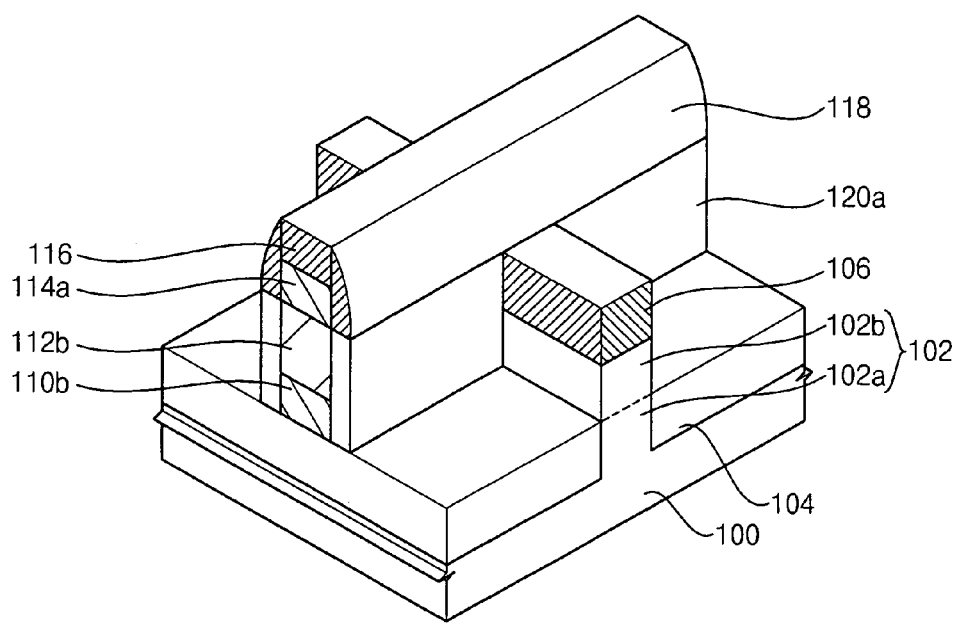

Referring to FIG. 10, the first insulation layer pattern 120 is partially etched using the second spacer 118 and the first hard mask layer pattern 106 as an etching mask to form a first spacer 120a beneath the second spacer 118.

Here, a conventional spacer is formed by an overall anisotropic etching process. On the contrary, the first spacer 120a is formed by a partial anisotropic etching process using the second spacer 118 as an etching mask. That is, a portion of the first insulation layer pattern 120 beneath the second spacer 118 remains. The remaining portion of the first insulation layer pattern 120 corresponds to the second spacer 118. In contrast, the rest portion of the first insulation layer pattern 120 is completely removed. Thus, an undesired spacer may not be formed on the sidewall of the active fin 102. Further, the sidewall of the first region 102b of the active fin 102 except for a portion of the sidewall, which is covered by the first preliminary conductive layer pattern 110b, the first dummy layer pattern 112b and the first spacer 120a, is exposed.

Here, when the isolation layer 104 beneath the first insulation layer pattern 120 is over-etched in anisotropically etching the first insulation layer pattern 120, insulation between adjacent electrical elements may be broken. In contrast, when the first insulation layer pattern 120 remains after performing the anisotropic etching process, the first region 102b of the active fin 102 is buried in the remaining first insulation layer pattern 120 so that an effective active region may have a reduced area.

Therefore, the anisotropic etching process may be preferably carried out to completely remove a portion of the first insulation layer pattern 120, which is not masked with the first spacer 120a, and prevent the isolation layer 104 from being etched.

Figure 11:
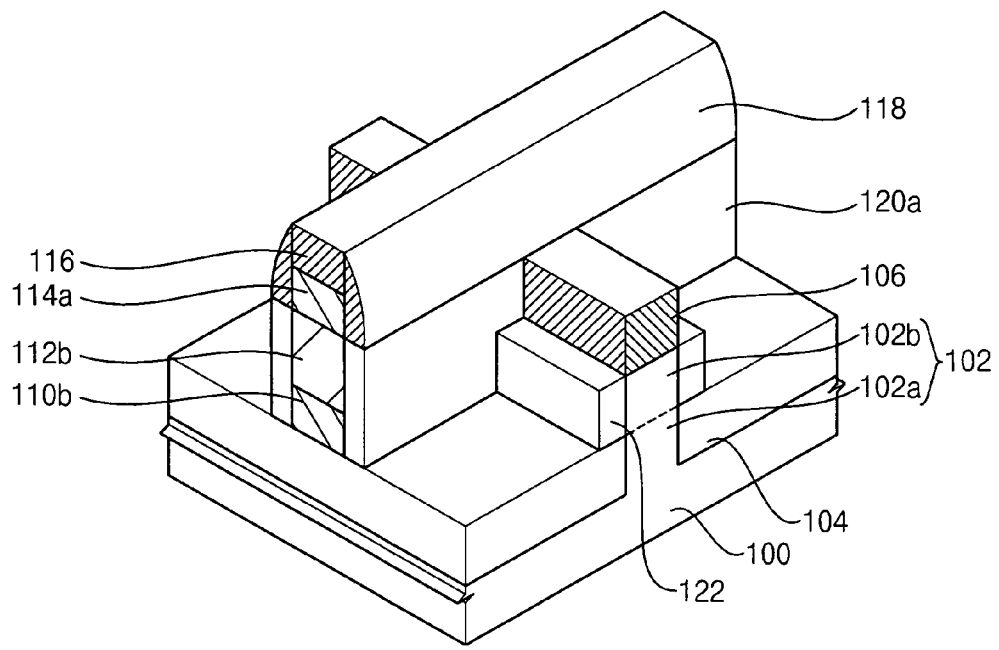

Referring to FIG. 11, single crystalline silicon grows on the sidewall of the second region 102a of the active fin 102 by a selective epitaxial growth (SEG) process to form an active extension layer 122. The active extension layer 122 makes direct contact with the first spacer 120a.

Here, the SEG process may include a low pressure chemical vapor deposition (LPCVD) process, an ultra high vacuum chemical vapor deposition (UHVCVD) process, an atmospheric pressure chemical vapor deposition (APCVD) process, a molecular beam epitaxy (MBE) process, etc. To reduce resistances of source/drain regions, the active extension layer 122 may have a width of no less than about 50 nm.

Impurities are then implanted into the active extension layer 122 and the active fin 102 to form the source/drain regions. The active extension layer 122 functions as to increase areas of the source/drain regions. Thus, the source/drain regions may have reduced resistances and a driving current of the transistor may be increased. Furthermore, when polarities of the source/drain regions are reversed, the reversed source/drain regions may have substantially the same electrical characteristic so that the fin type field effect transistor may be more stably operated.

Figure 12:
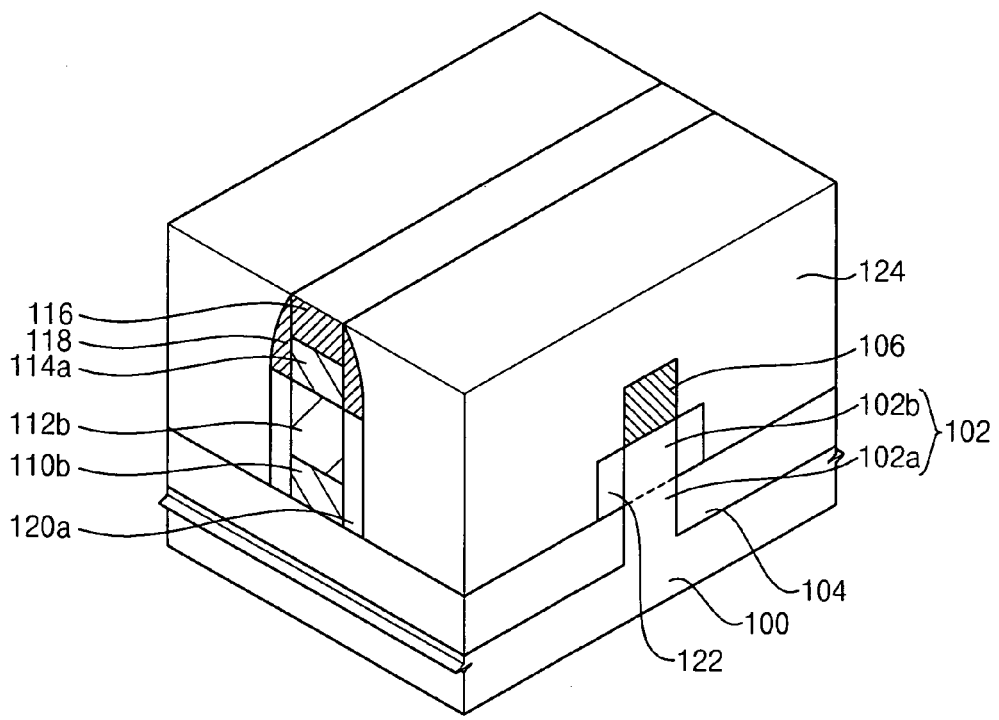

Referring to FIG. 12, a second insulation layer (not shown) is formed on the isolation layer 104 to cover the second hard mask layer pattern 116. That is, the second insulation layer has a surface higher than that of the second hard mask layer pattern 116.

The second insulation layer is removed by a CMP process until the surface of the second hard mask layer pattern 116 is exposed to form a second insulation layer pattern 124.

Figure 13:
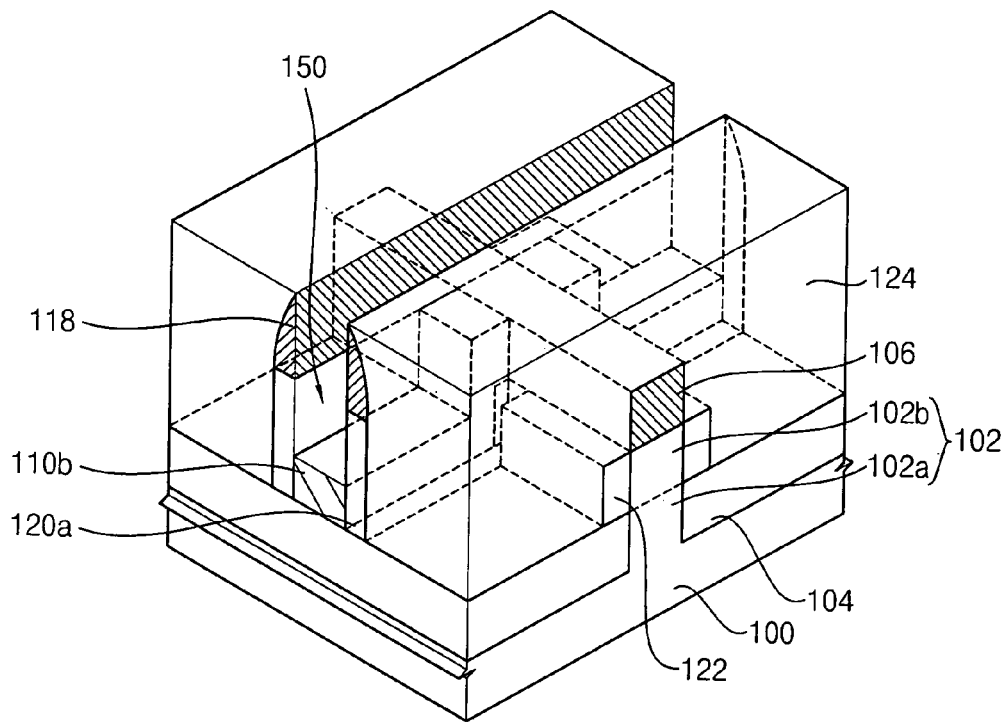

Referring to FIG. 13, the exposed second hard mask layer pattern 116 is selectively removed. Here, the second hard mask layer pattern 116 and the second spacer 118 include the silicon nitride. Thus, when the second hard mask layer pattern 116 is removed by an isotropic etching process, the second spacer 118 as well as the second hard mask layer pattern 116 is removed. Thus, the second hard mask layer pattern 116 is removed by an anisotropic etching process.

In contrast, when a silicon oxide layer is formed on the second dummy layer pattern 114a and the second hard mask layer pattern 116 before forming the insulation layer for the second spacer, the silicon oxide layer electrically isolates between the second hard mask layer pattern 116 and the second spacer 114a. Thus, when the second hard mask layer pattern 116 is removed by an isotropic etching process, the second spacer 118 is not removed. As a result, under the above-mentioned condition, the second hard mask layer pattern 116 may be selectively removed by the isotropic etching process.

The second dummy layer pattern 114a is then removed by a wet etching process or a dry etching process.

The first dummy layer pattern 120b is then removed. Here, when the first dummy layer pattern 120b is removed by a dry etching process using reactive ions, a surface of the first preliminary conductive layer pattern 110b beneath the first dummy layer pattern 120b may be damaged. Thus, the first dummy layer pattern 120b is removed by a wet etching process.

After the second hard mask layer pattern 116, the second dummy layer pattern 114a and the first dummy layer pattern 120b are removed, a trench 150 exposing the first preliminary conductive layer pattern 110b is formed.

Figure 14:
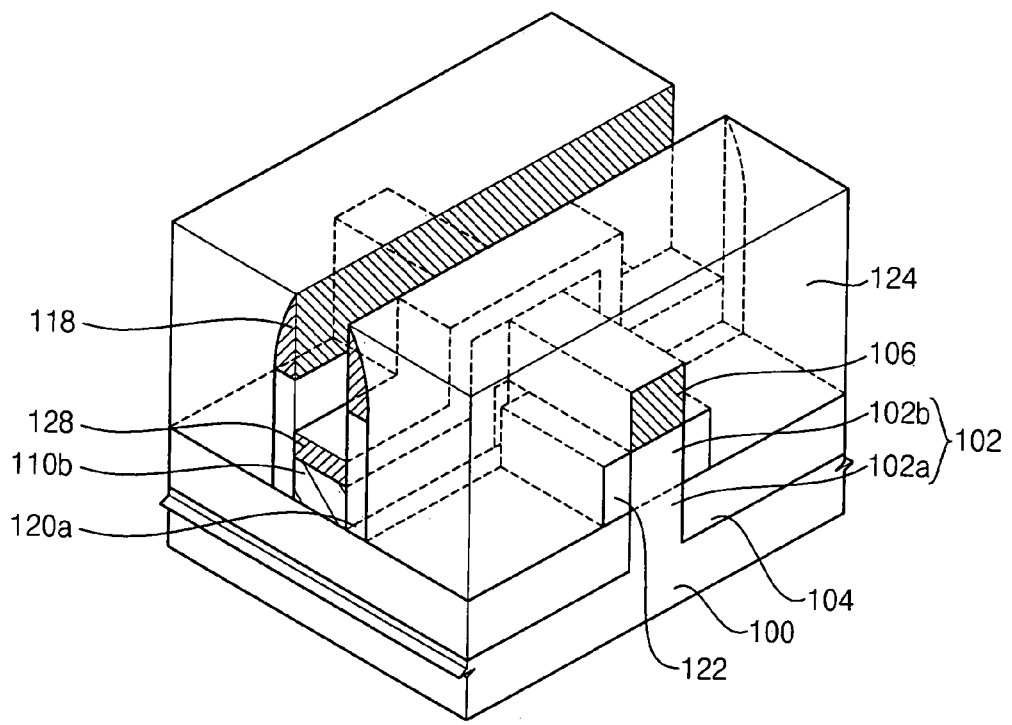

Referring to FIG. 14, a first metal layer 128 for forming metal silicide is formed on the first preliminary conductive layer pattern 110b and the second insulation layer pattern 124. Examples of the first metal layer 128 include cobalt, titanium, nickel, etc. The first metal layer 128 may be formed by a CVD process or PVD process.

Referring again to FIG. 1, the first metal layer 128 is thermally treated to react metal in the first metal layer 128 with the polycrystalline silicon in the first preliminary conductive layer pattern 110b. The polycrystalline silicon in the first preliminary conductive layer pattern 110b is fully converted into metal silicide by the thermal treatment process to form a first conductive layer pattern 130 including the metal silicide. The first conductive layer pattern 130 serves as a gate electrode of the fin type field effect transistor. Here, the first conductive layer pattern 130 has a uniform thickness of about 300 Å to about 1,200 Å, preferably 500 Å to about 1,000 Å.

As shown in FIG. 14, the first metal layer 128 is formed on the surface of the first preliminary conductive layer pattern 110b. In contrast, since the second insulation layer pattern 124 is not formed on the sidewall of the first preliminary conductive layer pattern 110b, the first metal layer 128 is not formed on the sidewall of the first preliminary conductive layer pattern 110b. Thus, the metal and the polycrystalline silicon are reacted with each other in a vertical direction from the surface of the first preliminary conductive layer pattern 110b so that the metal silicide may have a uniform thickness and improved characteristics.

A portion of the first metal layer 128 non-reacted with the polycrystalline silicon can be completely removed by a wet etching process. A second metal layer (not shown) including metal silicide is formed on the first conductive layer pattern 130. The second metal layer is then planarized by a CMP process to form a second conductive layer pattern 132.

Embodiment 2

Figure 15:
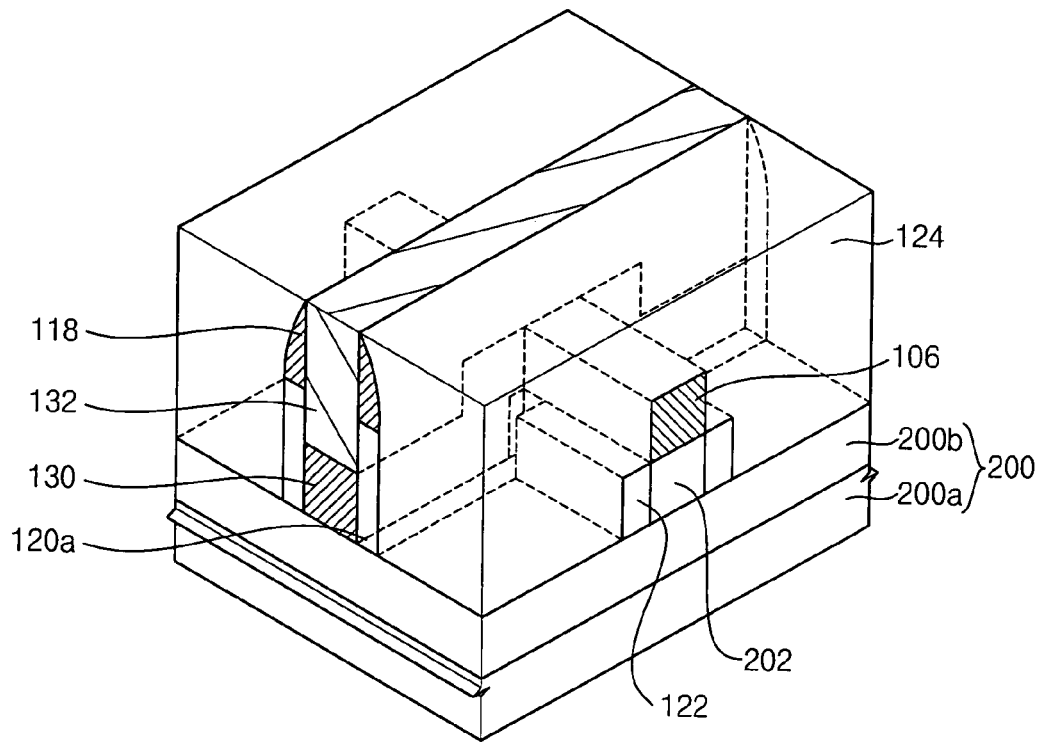
FIG. 15 is a cross sectional view illustrating a fin type field effect transistor in accordance with a second embodiment of the present invention.

FIG. 15 is a cross sectional view illustrating a fin type field effect transistor in accordance with a second embodiment of the present invention.

The exemplary fin type field effect transistor includes elements substantially identical to those in Embodiment 1 except for an SOI substrate. Accordingly, the same reference numerals are used to refer to the same elements and any further illustration and explanation with respect to the same elements is omitted herein for brevity.

Referring to FIG. 15, an active fin 202 is formed on the SOI substrate 200 including a silicon layer 200a and a buried oxide layer 200b sequentially stacked. Thus, the active fin 202 is not electrically connected to the silicon layer 200a of the SOI substrate 200. The fin type field effect transistor is formed on the active fin 202 and the buried oxide layer 200b using, for example, the methods described below.

Figure 16:
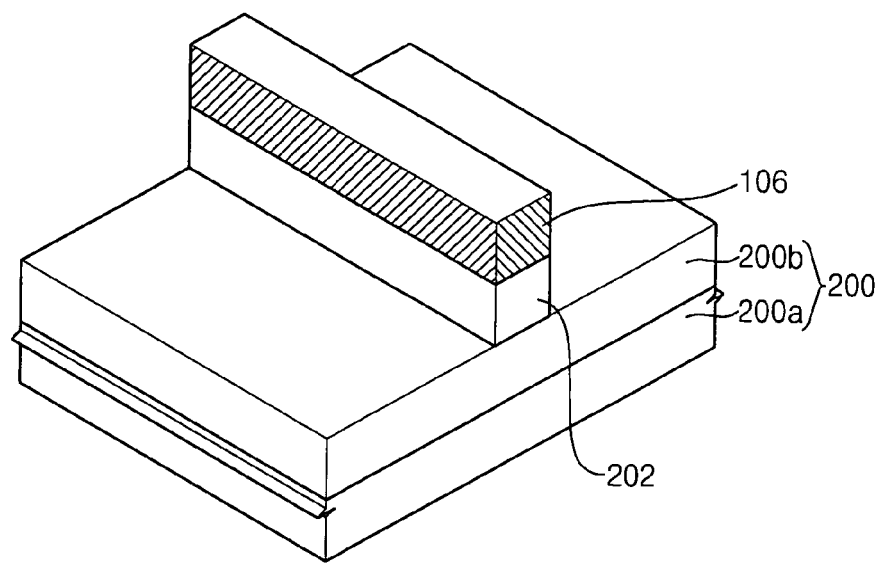
FIG. 16 is a cross sectional view illustrating methods of manufacturing the fin type field effect transistor in FIG. 15 in accordance with some embodiments of the present invention.

FIG. 16 is a cross sectional view illustrating methods of manufacturing the fin type field effect transistor in FIG. 15 in accordance with some embodiments of the present invention. The methods of manufacturing the exemplary fin type field effect transistor in accordance with some embodiments can include processes substantially identical to those explained above with regard to the first embodiment except for excluding the process for forming the isolation layer. Thus, the same reference numerals are used to refer to the same elements and any further illustrations and explanations with respect to those same elements is omitted herein for brevity.

Referring to FIG. 16, an SOI substrate 200 including a silicon layer 200a, a buried oxide layer 200b and an upper silicon layer (not shown) is prepared. A buffer oxide layer (not shown) is formed on the SOI substrate 200. A first hard mask layer (not shown) including silicon nitride is formed on the buffer oxide layer.

A photoresist film is formed on the first hard mask layer. The photoresist film is exposed and developed to form a photoresist pattern (not shown) for masking a region where an active fin for forming a fin type field effect transistor is formed. The first hard mask layer is etched using the photoresist pattern to form a first hard mask layer pattern 106.

The upper silicon layer is etched using the first hard mask layer pattern 106 until the buried oxide layer 200b is exposed to form the active fin 102. The active fin 102 extends in a first direction.

Here, to control a gate electrode at both sides of the active fin 102, the active fin 102 may have a width of no more than about 40 nm.

As described above, when the active fin 102 is formed on the SOI substrate 200, it is not needed to form an isolation layer, because the rest portion of the buried oxide layer 200b except form a portion of the buried oxide layer 200b covered by the active fin 102. That is, the active fin 102 is patterned to define an active region and a field region of the SOI substrate 200.

A gate insulation layer 108 is then formed on sidewalls of the active fin 102. Processes illustrated with reference to FIGS. 4 to 14 and 1 are carried out to complete the fin type field effect transistor of the present embodiment.

According to some embodiments of the present invention, the gate electrode includes metal silicide having uniform characteristics so that the fin type field effect transistor may have an increased threshold voltage. Moreover, since the active extension layer is formed on the sidewall of the active fin, the source/drain regions may have a reduced resistance so that the driving current may be increased.

Therefore, the fin type field effect transistor can have improved characteristics so that a circuit having the fin type field effect transistor may be more stably operated, which may allow the associated semiconductor device to operate correctly.

Having described the preferred embodiments of the present invention, it is noted that modifications and variations can be made by persons skilled in the art in light of the above teachings. It is therefore to be understood that changes may be made in the particular embodiment of the present invention disclosed which is within the scope and the spirit of the invention defined by the following claims.

What is claimed is:

1. A method of manufacturing a fin type field effect transistor, the method comprising:
    forming a first hard mask layer pattern on a substrate comprising a semiconductor material;
    partially etching the substrate using the first hard mask layer pattern as an etching mask to form an active fin extending in a direction away from a major surface of the substrate, wherein the active fin comprises a semiconductor material;
    forming a gate insulation layer pattern on a sidewall portion of the active fin;
    forming a first conductive layer pattern comprising a metal silicide on surfaces of the substrate and the gate insulation layer pattern, and on a sidewall of the first hard mask layer pattern;
    forming a first dummy layer pattern on the first conductive layer pattern, the first dummy layer pattern having a first etching selectivity with respect to the first conductive layer pattern;
    forming a second dummy layer pattern on the first dummy layer pattern, the second dummy layer pattern having a second etching selectivity with respect to the first conductive layer pattern; and
    forming source/drain regions in the active fin on opposite sides of the first conductive layer pattern.

2. The method of claim 1, wherein the substrate comprises a bulk silicon layer, a buried oxide layer, and an upper silicon layer, and the active fin is formed from the upper silicon layer by partially etching the upper silicon layer using the first hard mask layer pattern as an etching mask.

3. The method of claim 1, wherein the substrate comprises a silicon substrate, and the active fin is formed by partially etching the silicon substrate using the first hard mask layer pattern as an etching mask.

4. The method of claim 3, further comprising forming an isolation layer on the substrate after forming the active fin.

5. The method of claim 1, wherein the first conductive layer pattern is formed to have a uniform thickness.

6. The method of claim 1, wherein formation of the first conductive layer pattern, the first dummy layer pattern, and the second dummy layer pattern comprises:
    forming a first preliminary conductive layer comprising polycrystalline silicon on the substrate, the gate insulation layer pattern, and the first hard mask layer pattern;
    forming the first dummy layer on the first preliminary conductive layer;
    removing the first dummy layer and the first preliminary conductive layer until the first hard mask layer pattern is exposed to respectively form a first preliminary dummy layer pattern and a second preliminary conductive layer;
    forming the second dummy layer on the first preliminary dummy layer pattern, the second preliminary conductive layer, and the exposed first hard mask layer pattern;
    forming a second hard mask layer pattern on the second dummy layer; and
    etching the second dummy layer, the first preliminary dummy layer pattern and the second preliminary conductive layer using the second hard mask layer pattern as an etching mask to respectively form the second dummy layer pattern, the first dummy layer pattern, and the first conductive layer pattern.

7. The method of claim 6, wherein the first dummy layer is formed from a material comprising polycrystalline silicon germanium.

8. The method of claim 6, wherein the second dummy layer is formed from a material comprising polycrystalline silicon.

9. The method of claim 6, wherein after forming the first preliminary conductive layer pattern, the first dummy layer pattern, and the second dummy layer pattern, the method further comprising:
    forming spacers on sidewalls of the first preliminary conductive layer pattern, the first dummy layer pattern, and the second dummy layer pattern.

10. The method of claim 9, wherein forming spacers on sidewalls of the first preliminary conductive layer pattern, the first dummy layer pattern, and the second dummy layer pattern comprises;
    forming a second insulation layer pattern on the substrate to bury the active fin in the second insulation layer pattern, the second insulation layer pattern having an upper surface lower than an upper surface of the second dummy layer pattern relative to the major surface of the substrate;
    forming a second spacer on the second insulation layer pattern on opposite sides of the second dummy layer pattern and on opposite sides of the first dummy layer pattern; and
    etching the second insulation layer pattern using the second spacer as an etching mask to form a first spacer beneath the second spacer.

11. The method of claim 10, wherein after forming the spacers, the method further comprising epitaxially growing a semiconductor material from exposed sidewalls of the active fin to form an active extension layer.

12. The method of claim 11, wherein after forming the active extension layer, the method further comprising implanting impurities into the active extension layer and the active fin to form source/drain regions.

13. The method of claim 6, further comprising:
    after forming the first preliminary conductive layer pattern, forming a first insulation layer pattern on the substrate, the first insulation layer pattern partially exposing a surface of the first preliminary conductive layer pattern and having a surface higher from the major surface of the substrate than a surface of the first preliminary conductive layer pattern, wherein formation of the first insulation layer pattern comprises:
    covering the second hard mask layer pattern with a first insulation layer;
    removing the first insulation layer until a surface of the second hard mask layer pattern is exposed to form the first insulation layer pattern; and
    sequentially removing the second hard mask layer pattern, the second dummy layer pattern, and the first dummy layer pattern to expose a surface of the first preliminary conductive layer pattern.

14. The method of claim 6, wherein forming the first preliminary conductive layer comprises:
    forming a first metal layer on the first preliminary conductive layer pattern and the first hard mask layer pattern; and
    thermally treating to silicidate the first metal layer and form therefrom the first preliminary conductive layer.

15. The method of claim 14, wherein the first metal layer is formed to have a uniform thickness.

16. The method of claim 14, wherein after thermally treating the first metal layer, the method further comprises removing non-reacted portions of the first metal layer.

17. The method of claim 14, wherein before forming the first conductive layer pattern, the method further comprises doping the first preliminary conductive layer pattern with N type impurities or P type impurities.

18. The method of claim 1, wherein the first conductive layer pattern is formed to have a thickness of about 300 Å to about 1,200 Å.

19. The method of claim 1, further comprising forming a second conductive layer pattern comprising a metal on the first conductive layer pattern and the first hard mask layer pattern.

* * * * *